US012305057B2

(12) United States Patent
Sasaki et al.

(10) Patent No.: US 12,305,057 B2
(45) Date of Patent: May 20, 2025

(54) CONDUCTIVE RESIN COMPOSITION

(71) Applicant: SAKATA INX CORPORATION, Osaka (JP)

(72) Inventors: Masayuki Sasaki, Osaka (JP); Yuki Shirakawa, Osaka (JP); Ko Fukushima, Osaka (JP); Kaori Fujii, Osaka (JP)

(73) Assignee: SAKATA INX CORPORATION, Osaka (JP)

( * ) Notice: Subject to any disclaimer, the term of this patent is extended or adjusted under 35 U.S.C. 154(b) by 0 days.

(21) Appl. No.: 18/272,061

(22) PCT Filed: Oct. 28, 2021

(86) PCT No.: PCT/JP2021/039728
§ 371 (c)(1),
(2) Date: Jul. 12, 2023

(87) PCT Pub. No.: WO2022/163045
PCT Pub. Date: Aug. 4, 2022

(65) Prior Publication Data
US 2024/0084154 A1 Mar. 14, 2024

(30) Foreign Application Priority Data

Jan. 27, 2021 (JP) ................. 2021-010907
Jun. 1, 2021 (JP) ................. 2021-092292

(51) Int. Cl.
C09D 11/52 (2014.01)
C09D 11/037 (2014.01)
C09D 11/106 (2014.01)
H05K 1/09 (2006.01)

(52) U.S. Cl.
CPC ............ *C09D 11/52* (2013.01); *C09D 11/037* (2013.01); *C09D 11/106* (2013.01); *H05K 1/092* (2013.01)

(58) Field of Classification Search
CPC ..... C09D 11/52; C09D 11/037; C09D 11/106; C09D 11/103; C09D 129/14; H05K 1/092; H05K 1/095; C08K 9/12; C08K 2003/0806; C08K 2003/0812; C08K 2003/0831; C08K 2003/085; C08K 2003/0856; C08K 2003/0862; C08K 2003/0893; C08L 29/14; C08L 61/06; H01B 1/22
See application file for complete search history.

(56) References Cited

U.S. PATENT DOCUMENTS

| | | | | |
|---|---|---|---|---|
| 2003/0151028 A1* | 8/2003 | Lawrence | ............... | H05K 1/095 252/500 |
| 2014/0334071 A1 | 11/2014 | Endo et al. | | |
| 2015/0104625 A1 | 4/2015 | Shiozawa | | |
| 2015/0240099 A1* | 8/2015 | Chopra | ................. | C09D 11/52 252/513 |
| 2016/0251531 A1 | 9/2016 | Uchida et al. | | |
| 2020/0040229 A1 | 2/2020 | Vella et al. | | |
| 2020/0118702 A1 | 4/2020 | Ishii et al. | | |
| 2023/0272237 A1 | 8/2023 | Ito | | |

FOREIGN PATENT DOCUMENTS

| | | | |
|---|---|---|---|
| CN | 108948978 | A | 12/2018 |
| CN | 109754904 | A | 5/2019 |
| EP | 3648115 | A1 | 5/2020 |
| EP | 4180491 | A1 | 5/2023 |
| JP | H10162646 | A | 6/1998 |
| JP | H10247419 | A | 9/1998 |
| JP | 2002323038 | A | 11/2002 |
| JP | 2008055293 | A | 3/2008 |
| JP | 2009026558 | A | 2/2009 |
| JP | 2010047649 | A | 3/2010 |
| JP | 2016121241 | A | 7/2016 |
| JP | WO2014104053 | A1 | 1/2017 |
| JP | 2017228363 | A | 12/2017 |
| JP | 2018198133 | A | 12/2018 |

(Continued)

OTHER PUBLICATIONS

International Preliminary Report on Patentability, dated Jul. 31, 2023, for corresponding international application PCT/JP2021/039728 (1 page).

Notification Concerning Transmittal of International Preliminary Report on Patentability, mailed Aug. 10, 2023, for corresponding international application PCT/JP2021/039728 (1 page).

Notification of Transmittal of Translation of the International Preliminary Report on Patentability, mailed Aug. 10, 2023, for corresponding international application PCT/JP2021/039728 (1 page).

(Continued)

Primary Examiner — Mark Kopec
Assistant Examiner — Jaison P Thomas
(74) Attorney, Agent, or Firm — Law Office of Katsuhiro Arai

(57) ABSTRACT

An object of the present invention is to provide a conductive resin composition that achieves low volume resistivity and thus exhibits good conductivity when formed into a conductive film, offers good adhesion to various types of base materials, and demonstrates excellent storage stability, and therefore proves useful as a conductive ink, circuit connection material, etc. As a solution, a conductive resin composition is provided that contains: (a) one or more types of conductive powders selected from the group consisting of silver-based metal powders, copper-based metal powders, aluminum-based metal powders, iron-based metal powders, nickel-based metal powders, zinc-based metal powders, tin-based metal powders, and gold-based metal powders; and (b) a polyvinyl butyral-based resin; and also contains (c) a resol-type phenol-based resin by 0 to 75 parts by mass relative to 100 parts by mass of polyvinyl butyral-based resin.

3 Claims, No Drawings

(56) References Cited

FOREIGN PATENT DOCUMENTS

| | | | |
|---|---|---|---|
| JP | 2020205245 A | 12/2020 | |
| WO | 2013111438 A1 | 8/2013 | |
| WO | 2013161966 A1 | 10/2013 | |
| WO | 2014104053 A1 | 7/2014 | |
| WO | 2015064567 A1 | 5/2015 | |
| WO | WO-2020121599 A1 * | 6/2020 | ............... C08K 3/08 |

OTHER PUBLICATIONS

Written Opinion of the International Searching Authority, mailed Dec. 28, 2021, for corresponding international application PCT/JP2021/039728 (4 pages).
International Search Report (ISR) mailed Dec. 28, 2021, issued for International application No. PCT/JP2021/039728. (3 pages).
Extended European Search Report (EESR) dated Nov. 28, 2024, issued for European counterpart patent application No. EP21923051.3 (6 pages).
A Notice of Reasons for Refusal issued by the Japanese Patent Office, mailed Mar. 11, 2025, for Japanese counterpart application No. 2021-092292. (4 pages).

\* cited by examiner

CONDUCTIVE RESIN COMPOSITION

CROSS-REFERENCE TO RELATED APPLICATIONS

This application is the U.S. National Phase under 35 U.S.C. § 371 of International Application PCT/JP2021/039728, filed Oct. 28, 2021, which claims priority to Japanese Patent Application No. JP2021-010907, filed Jan. 27, 2021 and No. JP2021-092292, filed Jun. 1, 2021. The International Application was published under PCT Article 21 (2) in a language other than English.

TECHNICAL FIELD

The present invention relates to a conductive resin composition. Also, the present invention relates to a conductive ink used for screen-printing on a base material to form circuits, etc., as well as a circuit connection material used for conductively connecting an electronic component to a circuit board, etc.

BACKGROUND ART

Conductive resin compositions of various compositional makeups are known, which are used as conductive pastes, conductive inks, conductive paints, circuit connection materials and conductive adhesives, and the like, in various applications such as forming electronic circuits and bonding electronic components.

For example, there is a need for conductive inks that can be applied to various printing methods and useful in the manufacturing of, for example, interconnects, traces, electrodes, and other flexible plastic base materials having conductive structures.

For example, there is a need for circuit connection materials for high-density mounting of LED elements, semiconductor elements, capacitors, and various other electronic components on one circuit board, thereby making it highly integrated for use in computers, mobile phones, and other electronic devices.

However, the conventional conductive resin compositions offer low reliability of conductive connection because in many cases they have poor adhesion to such base materials as glass and plastic film, and do not provide enough adhesive force for bonding electronic components and circuits.

Also, with any of these conductive resin compositions, sometimes an insufficient dispersion of conductive powder leads to higher volume resistivity, and therefore insufficient conductivity, of a film constituted by the conductive resin composition.

Accordingly, there is a need for conductive resin compositions that prevent occurrence of short-circuit failures and therefore achieve high reliability of conductive connection in electronic devices whose wiring pattern intervals are becoming shorter to accommodate smaller components/higher circuit densities.

To address such need, Patent Literatures 1 to 3 describe conductive resin compositions containing conductive powders and resin components. However, these conductive resin compositions present room for improvement in one or more areas including adhesion to plastic base materials and glass, conductivity, and preservation stability.

BACKGROUND ART LITERATURE

Patent Literature

Patent Literature 1: Japanese Patent Laid-open No. Hei 10-162646

Patent Literature 2: International Patent Laid-open No. 2014/104053

Patent Literature 3: Japanese Patent Laid-open No. Hei 10-247419

SUMMARY OF THE INVENTION

Problems to be Solved by the Invention

No conductive resin composition has heretofore been known that has sufficient adhesion to plastic base materials and glass, as well as sufficient conductivity when formed into a film, demonstrates excellent storage stability, and is free of lead components that negatively affect the human body and the environment.

An object of the present invention is to provide a conductive resin composition that achieves low volume resistivity and thus exhibits good conductivity when formed into a conductive film, offers good adhesion to various types of base materials, and demonstrates excellent stored stability, and therefore proves useful as a conductive ink, circuit connection material, etc.

Means for Solving the Problems

As a result of studying in earnest to achieve the aforementioned object, the inventors of the present invention found that the aforementioned object could be achieved by a conductive resin composition having a specific compositional makeup, and eventually completed the present invention.

Specifically, the present invention is as follows.

[1] A conductive resin composition containing:
(a) one or more types of conductive powders selected from the group consisting of silver-based metal powders, copper-based metal powders, aluminum-based metal powders, iron-based metal powders, nickel-based metal powders, zinc-based metal powders, tin-based metal powders, and gold-based metal powders; and
(b) a polyvinyl butyral-based resin; and
also containing:
(c) a resol-type phenol-based resin by 0 to 75 parts by mass relative to 100 parts by mass of polyvinyl butyral-based resin.

[2] The conductive resin composition according to [1], wherein the conductive powder(s) is/are one or more types selected from the group consisting of silver-based metal powders, copper-based metal powders, and nickel-based metal powders.

[3] A conductive ink containing the conductive resin composition according to [1] or [2].

[4] A circuit connection material containing the conductive resin composition according to [1] or [2].

Effects of the Invention

The present invention demonstrates remarkable effects of achieving a low volume resistivity and thus exhibiting good conductivity when formed into a conductive film, offering good adhesion to various types of base materials, and demonstrating excellent storage stability, and therefore proving useful as a conductive ink, circuit connection material, etc.

Furthermore, the conductive resin composition proposed by the present invention can lower the film forming temperature when forming a conductive connection, which makes it possible to use, as base materials, those plastics with low melting points that are not conventionally used as base materials.

The conductive resin composition proposed by the present invention is useful as a printed electronics material, and extremely useful in the mass-production of display devices, vehicle-related components, IoT, mobile communication systems, and various other electronic devices, for example.

MODE FOR CARRYING OUT THE INVENTION

The present invention relates to a conductive resin composition, a conductive ink, and a circuit connection material. These are explained in detail below.
[Conductive Resin Composition]
<Conductive Powder>

The one or more types of conductive powders selected from the group consisting of silver-based metal powders, copper-based metal powders, aluminum-based metal powders, iron-based metal powders, nickel-based metal powders, zinc-based metal powders, tin-based metal powders, and gold-based metal powders is/are not specifically limited so long as each powder contains one of silver, copper, aluminum, iron, nickel, zinc, tin, or gold as a metal component. Examples include, for example, powders of the metals themselves, alloy powders containing the metals, and coated powders whose surface is at least partially coated with the metals. One type of conductive powder may be used alone, or two or more types may be combined.

Under the present invention, preferably one or more types of conductive powders are selected from the group consisting of silver-based metal powders, copper-based metal powders, and nickel-based metal powders in terms of conductivity, cost, etc. One or more types of silver-based metal powders is/are more preferred, inclusion of a silver-coated powder is yet more preferred, and use of silver-coated copper alone or a mixture of silver-coated copper powder and silver powder is most preferred. Silver-coated copper powders are preferred because they are highly conductive, cheaper than metal silver powders, and can prevent occurrence of copper migration.

The shape of each conductive powder is not specifically limited. Conductive powders of spherical, roughly spherical (such as having a length-to-width aspect ratio of 1.5 or less), flat, block-like, plate-like, polygonal pyramid, polyhedral, scale-like, bar-like, fiber-like, needle-like, or indeterminable shapes, and the like, may be used according to the purpose, etc. Under the present invention, conductive powders of spherical, roughly spherical, flat, or scale-like shapes are preferred from the viewpoints of oxidation resistance, volume resistivity, dispersibility, ease of handling, etc.

The volume-average particle size of each conductive powder is not specifically limited. The D50 is 0.001 µm or more, for example, but preferably 0.005 µm or more, or more preferably 0.01 µm or more; meanwhile, it is 50.0 µm or less, for example, but preferably 25.0 µm or less, or more preferably 15.0 µm or less. A D50 of 0.001 µm or more improves oxidation resistance of the conductive powder and achieves favorable dispersibility and ease of handling. A D50 of 50.0 µm or less achieves lower volume resistivity and achieves favorable dispersibility and ease of handling.
(Silver-Based Metal Powder)

Silver-based metal powders are not specifically limited so long as they are powders containing metal silver. Examples include metal silver powders, silver alloy powders, silver-coated powders, etc.

One type of silver-based metal powder may be used alone, or two or more types may be combined.

Metal silver powders are those obtained by pulverizing metal silver. Also, they may be silver nano-colloids or other silver nano-particles obtained through chemical reactions. The silver content in each metal silver powder is not specifically limited. It is 95.0% by mass or more, for example, but preferably 97.0% by mass or more, or more preferably 99.0% by mass or more.

Silver alloy powders are not specifically limited so long as they are alloy powders containing silver. The content of silver in each silver alloy powder may be determined as deemed appropriate from the viewpoint of what the melting point of the silver alloy powder would be, etc. It is preferably 5.0% by mass or more, or more preferably 7.0% by mass or more, or yet more preferably 10.0% by mass or more, while it is preferably under 99% by mass.

The content percentage of silver in each silver-containing powder can be easily measured using an X-ray fluorescence (XRF) spectrometer, etc.

Silver alloy powders include, for example, Ag—Cu-based alloys, Ag—Pd-based alloys, Ag—Pt-based alloys, etc.

Silver-coated powders are those whose particle surface is at least partially coated with metal silver.

For the particles that form each silver-coated powder, one or more types may be selected from the group consisting of, for example, metal particles (such as Cu particles, Pd particles, Al particles, alloy particles, etc.), organic polymer particles, glass, ceramic and other inorganic particles, mineral-based particles, etc.

Means for coating metal silver include plating, vapor deposition, and other means. The thickness of metal silver coating is not specifically limited. It is 0.01 µm or more, for example, but preferably 0.10 µm or more; meanwhile, it is 10.00 µm or less, for example, but preferably 5.00 µm or less. Also, the amount of silver film in each silver-coated powder is not specifically limited. Relative to the total amount of silver-coated powder, it is 0.3% by mass or more, for example, but preferably 0.5% by mass or more, or more preferably 1.0% by mass or more; meanwhile, it is 30.0% by mass or less, for example, but preferably 20.0% by mass or less, or more preferably 15.0% by mass or less.

Silver-based metal powders may further contain other atoms that inescapably find their way in. Among such other atoms, one or more types may be selected from the group consisting of, for example, Mn, Sb, Si, K, Na, Li, Ba, Sr, Ca, Mg, Be, Zn, Pb, Cd, Tl, V, Al, Zr, W, Mo, Ti, Co, Sn, Cu, Ni, Au, etc.

The content percentage of other atoms is 3.0% by mass or less, for example, but preferably 1.0% by mass or less, in each silver-containing powder.
(Copper-Based Metal Powder)

Copper-based metal powders are not specifically limited so long as they are powders containing metal copper. Examples include metal copper powders, copper alloy powders, copper-coated powders, etc.

One type of copper-based metal powder may be used alone, or two or more types may be combined.

Metal copper powders are those obtained by pulverizing metal copper. The copper content in each metal copper powder is not specifically limited. It is 95.0% by mass or more, for example, but preferably 97.0% by mass or more, or more preferably 99.0% by mass or more.

Copper alloy powders are not specifically limited so long as they are alloy powders containing copper. The content of copper in each copper alloy powder may be determined as deemed appropriate from the viewpoint of the melting point of the copper alloy powder, etc. It is preferably 5.0% by mass or more, or more preferably 7.0% by mass or more, or yet more preferably 10.0% by mass or more, while it is preferably under 99.9% by mass.

The content percentage of copper in each copper-containing powder can be easily measured using an X-ray fluorescence (XRF) spectrometer, etc.

Copper alloy powders include, for example, Cu—Ag-based alloys, Cu—Pd-based alloys, Cu—Sn-based alloys, etc.

Copper-coated powders are those whose particle surface is at least partially coated with metal copper.

For the particles that form each copper-coated powder, one or more types may be selected from the group consisting of, for example, metal particles (such as Ag particles, Pd particles, Al particles, alloy particles, etc.), organic polymer particles, glass, ceramic and other inorganic particles, mineral-based particles, etc.

Means for coating metal copper include plating, vapor deposition, and other means. The thickness of metal copper coating is not specifically limited. It is 0.01 µm or more, for example, but preferably 0.10 µm or more; meanwhile, it is 10 µm or less, for example, but preferably 5 µm or less. Also, the amount of copper film in each copper-coated powder is not specifically limited. Relative to the total amount of copper-coated powder, it is 0.5% by mass or more, for example, but preferably 1.0% by mass or more, or more preferably 5.0% by mass or more; meanwhile, it is 30.0% by mass or less, for example, but preferably 20.0% by mass or less, or more preferably 15.0% by mass or less.

Copper-based metal powders may further contain other atoms that inescapably find their way in. Among such other atoms, one or more types may be selected from the group consisting of, for example, Mn, Sb, Si, K, Na, Li, Ba, Sr, Ca, Mg, Be, Zn, Pb, Cd, Tl, V, Al, Zr, W, Mo, Ti, Co, Sn, Ag, Ni, Au, etc.

The content percentage of other atoms is 3.0% by mass or less, for example, but preferably 1.0% by mass or less, in each copper-containing powder.

(Nickel-Based Metal Powder)

Nickel-based metal powders are not specifically limited so long as they are powders containing metal nickel. Examples include metal nickel powders, nickel alloy powders, nickel-coated powders, etc.

One type of nickel-based metal powder may be used alone, or two or more types may be combined.

Metal nickel powders are those obtained by pulverizing metal nickel. The nickel content in each metal nickel powder is not specifically limited. It is 95.0% by mass or more, for example, but preferably 97.0% by mass or more, or more preferably 99.0% by mass or more.

Nickel alloy powders are not specifically limited so long as they are alloy powders containing nickel. The content of nickel in each nickel alloy powder may be determined as deemed appropriate from the viewpoint of what the melting point of the nickel alloy powder would be, etc. It is preferably 3.0% by mass or more, or more preferably 5.0% by mass or more, or yet more preferably 10.0% by mass or more, while it is preferably under 95.0% by mass.

The content percentage of nickel in each nickel-containing powder can be easily measured using an X-ray fluorescence (XRF) spectrometer, etc.

Nickel alloy powders include, for example, Ni—Fe-based alloys (Ni-58Fe, etc.), Ni—Cu-based alloys (Ni-75Cu, etc.), Ni—Cu—Zn-based alloys (Ni-6Cu-20Zn, etc.), Ni—Cr-based alloys, Ni—Cr—Ag-based alloys, etc.

Nickel-coated powders are those whose particle surface is at least partially coated with metal nickel.

For the particles that form each nickel-coated powder, one or more types may be selected from the group consisting of, for example, metal particles (such as Cu particles, Ag particles, Pd particles, alloy particles, etc.), organic polymer particles, glass, ceramic and other inorganic particles, mineral-based particles, etc.

Means for coating metal nickel include plating, vapor deposition, and other means. The thickness of metal nickel coating is not specifically limited. It is 0.01 µm or more, for example, but preferably 0.10 µm or more; meanwhile, it is 10 µm or less, for example, but preferably 5 µm or less. Also, the amount of nickel film in each nickel-coated powder is not specifically limited. Relative to the total amount of nickel-coated powder, it is 0.5% by mass or more, for example, but preferably 1.0% by mass or more, or more preferably 5.0% by mass or more; meanwhile, it is 30.0% by mass or less, for example, but preferably 20.0% by mass or less, or more preferably 15.0% by mass or less.

Nickel-based metal powders may further contain other atoms that inescapably find their way in. Among such other atoms, one or more types may be selected from the group consisting of, for example, Ag, Mn, Sb, Si, K, Na, Li, Ba, Sr, Ca, Mg, Be, Zn, Pb, Cd, Tl, V, Al, Zr, W, Mo, Ti, Co, Sn, Au, etc.

The content percentage of other atoms is 3.0% by mass or less, for example, but preferably 1.0% by mass or less, in each nickel-containing powder.

(Content)

The content of conductive powder in the conductive resin composition is not specifically limited. It may be determined as deemed appropriate from the viewpoint of the conductivity of the conductive resin composition, etc. When the total amount of conductive powder, polyvinyl butyral-based resin, and resol-type phenol-based resin represents 100% by mass, it is 5.0% by mass or more, for example, but preferably 60.0% by mass or more, or more preferably 70.0% by mass or more, or yet more preferably 80.0% by mass or more; meanwhile, it is 97.0% by mass or less, for example, but preferably 95.0% by mass or less.

<Polyvinyl Butyral-Based Resin>

Polyvinyl butyral-based resins are resins obtained by acetalizing the alcohol part of a polyvinyl alcohol with butyraldehyde. In general, they are thermoplastic resins containing vinyl butyral units expressed by Formula (1) below, vinyl acetate units expressed by Formula (2) below, and vinyl alcohol units expressed by Formula (3) below, as primary repeating units.

[Chem. 1]

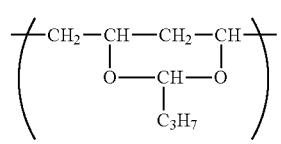
(1)

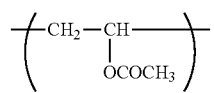
(2)

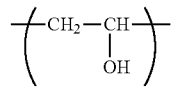
(3)

Polyvinyl butyral-based resins change their physical property, chemical property, mechanical property, etc., according to the ratios of the units per Formulas (1) to (3) above as well as the weight-average molecular weight (degree of polymerization).

For example, when there are more vinyl butyral units expressed by Formula (1) in a polyvinyl butyral-based resin (higher degree of butyralization), its compatibility, solubility in non-polar solvents, etc., will improve. When there are more vinyl acetate units expressed by Formula (2) (increased amount of acetyl groups), the viscosity of the resin when dissolved in a solvent can be lowered, which means that the glass transition temperature of the resin can be lowered. When there are more vinyl alcohol units expressed by Formula (3), the resin's adhesion, solubility in polar solvents, etc., can be improved.

Under the present invention, the quantitative ratio of butyral groups, acetyl groups, and hydroxyl groups in the polyvinyl butyral-based resin is not specifically limited. Assuming that the total amount of these groups represents 100 mol, for example, the butyral groups account for 55.0% by mol or more but 80.0% by mol or less, acetyl groups account for 25.0% by mol or less, and hydroxyl groups account for 10.0% by mol or more but 20.0% by mol or less.

It should be noted that, under the present invention, the greater the amount of acetyl groups, the better, when a nickel-based metal powder is used as a conductive powder. For example, preferably a polyvinyl butyral-based resin with acetyl groups amounting to 7.0% by mol or more but 25.0% by mol or less is used.

The weight-average molecular weight of the polyvinyl butyral-based resin is not specifically limited. From the viewpoints of the mechanical characteristics of the conductive resin composition, its solvent compatibility, etc., it is 10,000 or more, for example, but preferably 20,000 or more; meanwhile, it is 250,000 or less, for example, but preferably 120,000 or less.

Regarding the method for manufacturing the polyvinyl butyral-based resin, any publicly known method may be used without limitations. Examples include a method of reacting an aqueous polyvinyl alcohol solution with butyraldehyde in the presence of an acid catalyst, neutralizing the produced slurry of polyvinyl butyral-based resin with an alkali, and separating the solvent, followed by washing/dehydration and subsequent drying, to manufacture a resin in powder form.

As the polyvinyl butyral-based resin, a synthesized resin may be used or a commercial product may be used. Among the commercial products, one or more types may be selected from the group consisting of, for example, those under the product name S-LEC Series manufactured by Sekisui Chemical Co., Ltd. (such as BL-1, BL-1H, BL-2H, BL-5Z, BL-7Z, BL-10, BL-S, BM-1, BM-2, BM-5, BM-S, BM-SHZ, BH-3, BH-6, BH-A, BH-S, BX-1, BX-L, BX-3, BX-5, KS-1, KS-5Z, KS-6Z, KS-10, KX-1, KX-5, KW-M, KW-10, SV-12, SV-16, SV-22, SV-26, etc.), and those under the product name Mowital Series manufactured by Kuraray Co., Ltd. (such as LPB16B, B20H, 30T, 30H, 30HH, 45M, 45H, 60H, 60T, 60HH, 70HH, 75H, etc.).

The content of polyvinyl butyral-based resin in the conductive resin composition is not specifically limited. It may be determined as deemed appropriate from the viewpoint of the conductivity of the conductive resin composition, etc. Assuming that the total amount of conductive powder, polyvinyl butyral-based resin, and resol-type phenol-based resin represents 100% by mass, it is 1.0% by mass or more, for example, but preferably 1.5% by mass or more, or more preferably 2.0% by mass or more; meanwhile, it is 25.0% by mass or less, for example, but preferably 20.0% by mass or less, or more preferably 17.0% by mass or less.

<Resol-Type Phenol-Based Resin>

Resol-type phenol-based resins are resins obtained by reacting a phenol-based compound with formaldehyde under an alkali catalyst.

Among the phenol-based compounds, one or more types may be selected from the group consisting of, for example, phenols, alkylphenols having branched or unbranched alkyl groups with 1 to 20 carbon atoms (cresol, xylenol, t-butylphenol, etc.), phenylphenols, resorcinol, etc.

It should be noted that modified resol-type phenol-based resins manufactured by adding various modifiers when a phenol-based compound is reacted with formaldehyde under an alkali catalyst, may be used.

The molecular weight of the resol-type phenol-based resin is not specifically limited. From the viewpoint of the solution viscosity of the resin in solution state, it is 200 or more, for example, but preferably 300 or more; meanwhile, it is 10,000 or less, for example, but preferably 3,000 or less.

As the resol-type phenol-based resin, a synthesized resin may be used or a commercial product may be used. Among the commercial products, one or more types may be selected from the group consisting of, for example, the TACKIROL Series manufactured by Taoka Chemical Co., Ltd., HITANOL Series manufactured by Hitachi Chemical Co., Ltd., H, HF, MWF, DL, MEHC and MEH Series manufactured by Meiwa Plastic Industries, Ltd., TAMANOL Series manufactured by Arakawa Chemical Industries, Ltd., RESITOP Series manufactured by Gun Ei Chemical Industry Co., Ltd., BSR Series manufactured by Aica SDK Phenol Co., Ltd., SP Series manufactured by Schenectady International, Inc., etc.

In the conductive resin composition, the amount of resol-type phenol-based resin is 75.0 parts by mass or less, for example, but preferably 50.0 parts by mass or less, relative to 100 parts by mass of polyvinyl butyral-based resin, from the viewpoint of the conductivity of the conductive resin composition, etc.

For example, the conductive resin composition can be formed without containing any resol-type phenol-based resin (amount used is 0% by mass). Also, a conductive resin composition containing, relative to 100 parts by mass of polyvinyl butyral-based resin, 0.1 parts by mass or more, for example, but preferably 0.5 parts by mass or more, or more preferably 1.0 part by mass or more, and 75.0 parts by mass or less, for example, but preferably 50.0 parts by mass or less, or more preferably 40.0 parts by mass or less, of resol-type phenol-based resin, may be formed.

Resol-type phenol-based resins have autoreactive functional groups and thus provide an advantage in that they can be crosslinked and cured by means of heating, for example.

<Other Components>

The conductive resin composition proposed by the present invention can have one or more types of various additives mixed therein, as necessary, which are selected from the group consisting of solvents, resins other than polyvinyl butyral-based resins and resol-type phenol-based resins, lead-free solder particles, organic acid compounds, pigments, fillers, antioxidants, anticorrosive agents, surfactants, defoaming agents, dispersants, viscosity-adjusting agents (thixotropy-adjusting agents), adhesion-imparting agents, coupling agents, anti-settling agents, pH adjusting agents (amine compounds), leveling agents, UV absorbents, flame retardants, etc.

(Solvent)

The conductive resin composition proposed by the present invention may contain a solvent. This improves the fluidity of the conductive resin composition, which in turn contributes to improved workability. Also, mixing the conductive resin composition with a solvent allows a conductive resin paste, conductive ink, or circuit-connecting agent to be constituted.

For the solvent, any one or more types selected from the group consisting of water and various organic solvents may be used. Among the organic solvents, one or more types may be selected from the group consisting of, for example: ethyl alcohol, propyl alcohol, butyl alcohol, pentyl alcohol, hexyl alcohol, heptyl alcohol, octyl alcohol, nonyl alcohol, decyl alcohol, ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether, propylene glycol monobutyl ether, methyl methoxy butanol, α-terpineol, β-terpineol, hexylene glycol, benzyl alcohol, 2-phenylethyl alcohol, isopalmityl alcohol, isostearyl alcohol, lauryl alcohol, ethylene glycol, propylene glycol or glycerin and other alcohols; acetone, methyl ethyl ketone, methyl isobutyl ketone, cyclohexanone, diacetone alcohol (4-hydroxy-4-methyl-2-pentanone), 2-octanone, isophorone (3,5,5-trimethyl-2-cyclohexen-1-one), diisobutyl ketone (2,6-dimethyl-4-heptanone), and other ketone-based solvents; ethyl acetate, butyl acetate, diethyl phthalate, dibutyl phthalate, acetoxyethane, methyl lactate, methyl hexanoate, methyl octanoate, methyl decanoate, 1,2-diacetoxyethane and other ester-based solvents; tetrahydrofuran, dimethyl ether, diethyl ether, dipropyl ether, ethylene glycol dimethyl ether, ethylene glycol diethyl ether, ethylene glycol dibutyl ether, propylene glycol dimethyl ether, ethoxyethyl ether, 1,2-bis(2-diethoxy) ethane or 1,2-bis(2-methoxyethoxy) ethane and other ether-based solvents; 2-(2-buthoxyethoxy)ethyl acetate, methyl cellosolve acetate, ethylene glycol monobutyl ether acetate, propylene glycol monomethyl ether acetate, diethylene glycol monoethyl ether acetate and other ether ester-based solvents; 2-(2-methoxyethoxy) ethanol and other ether alcohol-based solvents; benzene, toluene, xylene, n-paraffin, isoparaffin, dodecylbenzene, terpene oil, kerosene or light oil and other hydrocarbon-based solvents; acetonitrile, propionitrile and other nitrile-based solvents; dimethylacetamide, N,N-dimethylformamide, N-methyl-2-pyrrolidone and other nitrogen-containing polar solvents; silicone oil-based solvents, etc.

For the solvent, preferably one or more types is/are selected from the group consisting of alcohol-based solvents, ether-based solvents, ester-based solvents, ether ester-based solvents, and ketone-based solvents. One or more types selected from ether-based solvents, ester-based solvents, and ether ester-based solvents is/are more preferred.

When a solvent is used, the amount used is not specifically limited and should be adjusted as deemed appropriate so that the viscosity of the conductive resin composition will represent a level of viscosity that allows for proper application, printing, etc., on a base material and/or a level of viscosity that allows for proper impregnation in a porous body.

(Resin Other than Polyvinyl Butyral-Based Resins and Resol-Type Phenol-Based Resins)

The conductive resin composition proposed by the present invention may contain a resin other than polyvinyl butyral-based resins and resol-type phenol-based resins. The resin other than polyvinyl butyral-based resins and resol-type phenol-based resins may be either a thermosetting resin or thermoplastic resin, where any one type may be used alone or two or more types may be combined.

Among the thermosetting resins, one or more types may be selected from the group consisting of, for example, epoxy-based resins, novolac-type phenol-based resins, polyimide-based resins, polyurethane-based resins, melamine-based resins, urea-based resins, etc.

Among the thermoplastic resins, one or more types may be selected from the group consisting of, for example, polyolefin-based resins, polyester-based resins, poly(meth) acrylic-based resins, phenoxy resins, thermoplastic polyurethane-based resins, polyamide-based resins, polycarbonate-based resins, polyphenylene ether-based resins, polyvinyl ether-based resins, polyvinyl alcohol-based resins, polyvinyl acetate-based resins, ionomer resins, etc.

When a resin other than polyvinyl butyral-based resins and resol-type phenol-based resins is used, the amount used is not specifically limited and should be adjusted as deemed appropriate according to the mode of use of the conductive resin composition, required properties, etc.

(Lead-Free Solder Powder)

The conductive resin composition proposed by the present invention may contain a lead-free solder powder, in consideration of the impact on workers and users, the environment, etc.

The lead-free solder powder is not specifically limited so long as it does not contain lead by an amount equal to or more than what inescapably finds its way in.

The melting point of the lead-free solder powder is preferably 300° C. or lower, or more preferably 220° C. or lower, or yet more preferably 50° C. or higher and 220° C. or lower. If the melting point of the lead-free solder powder exceeds 300° C., the circuit board, electronic component, or other connected member may undergo thermal failure or thermal deterioration. If the melting point is under 50° C., mechanical strength may weaken to reduce the reliability of conductive connection.

For the lead-free solder powder, one or more types may be selected from the group consisting of, for example, lead-free solder powders based on tin (Sn) and containing one or more types selected from the group consisting of silver (Ag), bismuth (Bi), zinc (Zn), copper (Cu), indium (In), aluminum (Al), antimony (Sb), etc. (such as Sn—Bi-based, Sn—Cu-based, Sn—Sb-based, Sn—Zn-based, Sn—Ag-based, Sn—Ag—Cu-based, Sn—Zn—Bi-based, Sn—Ag—In—Bi-based, Sn—Zn—Al-based, Sn—Ag—Bi-based, Sn—Ag—Cu—Bi-based, Sn—Ag—Cu—Bi—In—Sb-based, etc.), lead-free solder powders based on Bi (Bi—In-based, etc.), and lead-free solder powders based on In (In—Ag-based, In—Bi-based, etc.).

The shape of the lead-free solder powder is not specifically limited. Lead-free solder powders of spherical, roughly spherical (such as having a length-to-width aspect ratio of 1.5 or less), flat, polyhedral, scale-like, fiber-like, or indeterminable shapes, and the like, may be used according to the purpose, etc. Under the present invention, lead-free solder powders of spherical, roughly spherical, flat, or scale-like shapes are preferred from the viewpoints of connection stability, volume resistivity, dispersibility, ease of handling, etc.

The volume-average particle size of the lead-free solder powder is not specifically limited. The D50 is 0.5 μm or more, for example, but preferably 1.0 μm or more, or more preferably 5.0 μm or more; meanwhile, it is 50.0 μm or less, for example, but preferably 40.0 μm or less, or more preferably 30.0 μm or less. If the D50 is under 0.5 μm, dispersibility and ease of handling of the lead-free solder powder may drop. A D50 exceeding 50.0 µm may result in lower connection stability, higher volume resistivity, and lower dispersibility and ease of handling.

When a lead-free solder powder is used, the amount used is not specifically limited and should be adjusted as deemed appropriate according to the mode of use of the conductive resin composition, required properties, etc. Assuming that the total amount of conductive powder, polyvinyl butyral-based resin, and resol-type phenol-based resin represents 100% by mass, it may be 75.0% by mass or less, for example.

(Organic Acid Compound)

Among the organic acid compounds, one, or two or more types of organic acid compounds expressed by R-Xn (in the formula, R represents hydrogen or an organic group with 1 to 50 carbon atoms, X represents an acid group where the multiple X's may be different from one another, and n represents an integer of 1 or greater) may be used, for example.

The acid group expressed by X may be, for example, carboxyl group (—COOH), carboxylic acid anhydride group (—C(=O)—O—C(=O)—), sulfonic acid group (—SO$_3$H), phosphoric acid group (—PO$_3$H$_2$), etc.

An organic acid compound may be, for example, an organic carboxylic acid compound, organic carboxylic acid anhydride, organic sulfonic acid compound, organic phosphonic acid compound, etc.

Use of an organic acid compound improves dispersibility of the conductive powder, for example, to allow for efficient placement, resulting in higher reliability of conductive connection and insulation.

{Organic Carboxylic Acid Compound}

Organic carboxylic acid compounds are not specifically limited so long as they are compounds with 1 to 50 carbon atoms having one or more carboxyl groups (—COOH) in the molecular structure.

Among the organic carboxylic acid compounds, one or more types may be selected from the group consisting of, for example, formic acid, acetic acid, propionic acid, stearic acid, lactic acid, malic acid, tartaric acid, succinic acid, maleic acid, fumaric acid, benzoic acid, ascorbic acid, glutaric acid, abietic acid, malonic acid, dodecanedioic acid, eicosanedioic acid, citric acid, sebacic acid, capric acid, arachidonic acid, docosahexaenoic acid, dodecenylsuccinic acid, itaconic acid, dimethylolpropionic acid, trimethylolpropanoic acid, salicylic acid, 2-ethylhexanoic acid, acrylic acid, methacrylic acid, crotonic acid, oxalic acid, adipic acid, hexanetricarboxylic acid, cyclohexyl carboxylic acid, 1,4-cyclohexyl dicarboxylic acid, ethylenediaminetetraacetic acid, isophthalic acid, terephthalic acid, naphthalene dicarboxylic acid, trimellitic acid, pyromellitic acid, etc.

{Organic Carboxylic Acid Anhydride}

Organic carboxylic acid anhydrides are not specifically limited so long as they are compounds having one or more carboxylic acid anhydride groups (—C(=O)—O—C (=O)—) in the molecular structure.

Organic carboxylic acid anhydrides are those obtained through an intermolecular dehydration involving two organic carboxylic acid molecules and/or intramolecular dehydration involving one organic carboxylic acid molecule. Under the present invention, one or more types may be selected from the group consisting of, for example, acetic acid anhydride, propionic acid anhydride, oxalic acid anhydride, maleic acid anhydride, phthalic acid anhydride, benzoic acid anhydride, succinic acid anhydride, 2-methylsuccinic acid anhydride, etc.

{Organic Sulfonic Acid Compound}

Organic sulfonic acid compounds are not specifically limited so long as they are compounds having one or more sulfonic acid groups (—SO$_3$H) in the molecular structure.

For example, one or more types may be selected from the group consisting of benzenesulfonic acid, n-dodecylbenzenesulfonic acid, cumene sulfonic acid, xylene sulfonic acid, cresol sulfonic acid, p-phenolsulfonic acid, p-toluenesulfonic acid, 2-naphthalenesulfonic acid, styrenesulfonic acid, 4,4-biphenyldisulfonic acid, m-benzenedisulfonic acid, aniline-2,4-disulfonic acid, polystyrene sulfonic acid and other aromatic sulfonic acid compounds; methanesulfonic acid, ethanesulfonic acid, 1-propanesulfonic acid, trifluoromethanesulfonic acid, 1,3-propanedisulfonic acid, aminomethanesulfonic acid, 2-aminoethanesulfonic acid and other aliphatic sulfonic acid compounds; cyclopentanesulfonic acid, cyclohexanesulfonic acid, 3-cyclohexylaminopropanesulfonic acid and other alicyclic sulfonic acid compounds, etc.

{Organic Phosphonic Acid Compound}

Organic phosphonic acid compounds are not specifically limited so long as they are compounds having one or more phosphoric acid groups (—PO$_3$H$_2$) in the molecular structure.

For example, one or more types may be selected from the group consisting of 1-hydroxyethylidene-1,1-diphosphonic acid, 1-hydroxypropylidene-1,1-diphosphonic acid, 1-hydroxybutylidene-1,1-diphosphonic acid, aminotrimethylene phosphonic acid, methyl diphosphonic acid, nitrotrismethylene phosphonic acid, ethylenediamine tetramethylene phosphonic acid, ethylenediamine bismethylene phosphonic acid, hexamethylenediamine tetramethylene phosphonic acid, diethylenetriamine pentamethylene phosphonic acid, cyclohexanediamine tetramethylene phosphonic acid, carboxyethyl phosphonic acid, phosphonoacetic acid, 2-phosphonobutane-1,2,4-tricarboxylic acid, 2,3-dicarboxypropane-1,1-diphosphonic acid, phosphonobutylic acid, phosphonopropionic acid, sulfonylmethyl phosphonic acid, N-carboxymethyl-N,N-dimethylene phosphonic acid, N,N-dicarboxymethyl-N-methylene phosphonic acid, 2-ethylhexyl acid phosphate, stearyl acid phosphate, benzene phosphonic acid, etc.

Organic phosphonic acid compounds may be surfactants having phosphoric acid groups in the molecular structure.

Among the surfactants having phosphoric acid groups, those having polyoxyethylene groups or phenyl groups in the molecular structure are preferred. For example, one or more types may be selected from the group consisting of polyoxyethylene alkylphenyl ether phosphoric acid, polyoxyethylene alkyl ether phosphoric acid, dipolyoxypropylene lauryl ether phosphoric acid, dipolyoxyethylene oleyl ether phosphoric acid, dipolyoxyethylene oxypropylene lauryl ether phosphoric acid, dipolyoxypropylene oleyl ether phosphoric acid, ammonium lauryl phosphate, ammonium octyl ether phosphate, ammonium cetyl ether phosphate, polyoxyethylene lauryl ether phosphoric acid, polyoxyethylene oxypropylene lauryl ether phosphoric acid, polyoxypropylene lauryl ether phosphoric acid, polyoxyethylene tristyrylphenyl ether phosphoric acid, polyoxyethylene oxypropylene tristyrylphenyl ether phosphoric acid, polyoxypropylene tristyrylphenyl ether phosphoric acid, etc.

Among the surfactants having phosphoric acid groups, one or more types selected from the group consisting of those under the product name PHOSPHANOL manufactured by Toho Chemical Industry Co., Ltd., DISPERBYK manufactured by BYK-Chemie Japan K.K., and other commercial products, may be used.

When an organic acid compound is used, the amount used is not specifically limited and should be adjusted as deemed appropriate according to the mode of use of the conductive resin composition, required properties, etc. Assuming that the total amount of conductive powder, polyvinyl butyral-based resin, and resol-type phenol-based resin represents 100% by mass, it is 0.1% by mass or more and 10.0% by mass or less, for example.

<Property of Conductive Resin Composition>

In terms of property, the conductive resin composition proposed by the present invention may have any desired property such as being in powder, solid, paste, or liquid (varnish) form. When its intended use is a conductive ink or circuit connection material, preferably the conductive resin composition is in paste or liquid (varnish) form at room temperature (20° C.).

<Properties of Conductive Resin Composition>

The conductive resin composition proposed by the present invention has excellent conductivity. Conductivity of the conductive resin composition is such that the volume resistivity of a conductive film obtained by casting or applying the conductive resin composition on a releasable base material and then drying and releasing the conductive resin composition, is under $2.0 \times 10^{-2}$ Ω·cm. The volume resistivity of the conductive film is preferably under $8.0 \times 10^{-3}$ Ω·cm, or more preferably under $7.0 \times 10^{-3}$ Ω·cm. Here, volume resistivity is obtained according to the method described in Examples.

The conductive resin composition proposed by the present invention has excellent adhesion to various types of base materials. Its adhesion to glass or PET is evaluated according to the method described in Examples.

Also, the conductive resin composition proposed by the present invention has excellent storage stability. When checked before and after storage for 2 months, the conductive resin composition does not thicken or otherwise change its viscosity, etc., and no settling/separation, etc., occurs, either.

<Method for Preparing Conductive Resin Composition>

When preparing the conductive resin composition proposed by the present invention, it can be manufactured by adding to a mixing container in any desired order, and mixing together, the essential components such as conductive powder and polyvinyl butyral-based resin, and, if necessary, additive components such as resol-type phenol-based resin component and solvent. When mixing, a method of mixing using a ball mill, roll mill, bead mill, planetary centrifugal mixer, planetary mixer, tumbler, stirrer, agitator, mechanical homogenizer, ultrasonic homogenizer, high-pressure homogenizer, paint shaker, V-type blender, Nauta mixer, Banbury mixer, knead roller, single-screw extruder, twin-screw extruder, etc., may be used as deemed appropriate.

When preparing the conducive resin composition, the temperature (temperature at which to mix the components) is not specifically limited. Heating, etc., may be applied, if necessary, at a temperature of 10° C. or higher and 100° C. or lower, for example.

When preparing the conducive resin composition, the atmosphere is not specifically limited. It may be performed in air or in an inert atmosphere.

<Intended Use of Conductive Resin Composition>

The intended use of the conductive resin composition proposed by the present invention may be manufacturing of conductive bodies. The conductive bodies may contain other members, etc., in addition to the conductive resin composition.

Among the conductive bodies, one or more types may be selected from the group consisting of, for example, conductive inks, circuit connection materials, conductive pastes, conductive films, conductive fibers, conductive paints, conductive materials for semiconductor packages, conductive material for microelectronic devices, antistatic materials, electromagnetic shield materials, anisotropic conductive adhesives (die-attaching adhesives, etc.), die-attaching pastes, actuators, sensors, and conductive molded resin products.

For example, a conductive ink, conductive paste, conductive paint, etc., can be constituted by using a solvent as a component of the conductive resin composition. In this case, viscosity is not specifically limited and the conductive resin composition may be in any form, from low-viscosity varnish to high-viscosity paste, etc., depending on the intended use, etc.

For example, the conductive resin composition containing a solvent, etc., as necessary, may be applied to any of various types of base materials according to the casting method, dipping method, bar coating method, dispenser method, roll coating method, gravure coating method, screen printing method, flexographic printing method, spray coating method, spin coating method, or inkjet method, etc., and then heated and dried at a temperature of 300° C. or lower, into a conductive film. For the atmosphere in which to dry, one or more types may be selected from the group consisting of air, inert gas, vacuum, reduced pressure, etc. Particularly from the viewpoint of preventing deterioration of the conductive film (preventing oxidation of the conductive powder, etc.), a nitrogen, argon, or other inert gas atmosphere is preferred.

The conductive resin composition proposed by the present invention can be molded according to extrusion molding, injection molding, compression molding, or other molding method, and used as a molded product. The molded product may be, for example, an electronic device component, automotive component, mechanical component for machinery, food container, film, sheet, fiber, etc.

[Conductive Ink]

The conductive ink proposed by the present invention can be obtained by dissolving and/or dispersing the conductive resin composition in a solvent.

The conductive ink proposed by the present invention, whose essential components are conductive powder and polyvinyl butyral-based resin, contains, if necessary, a resol-type phenol-based resin component as well as one or more types of various additive components selected from the group consisting of solvents, resins other than polyvinyl butyral-based resins and resol-type phenol-based resins, lead-free solder particles, organic acid compounds, pigment, fillers, antioxidants, anticorrosive agents, surfactants, defoaming agents, dispersants, viscosity-adjusting agents (thixotropy-adjusting agents), adhesion-imparting agents, coupling agents, anti-settling agents, pH adjusting agents (amine compounds), leveling agents, UV absorbents, flame retardants, etc.

The conductive ink is obtained by putting the components in a mixing container and then mixing them together into a varnish or paste form using one or more types of mixers selected from the group consisting of ball mills, roll mills, bead mills, planetary centrifugal mixers, planetary mixers, tumblers, stirrers, agitators, mechanical homogenizers, ultrasonic homogenizers, high-pressure homogenizers, paint shakers, etc.

The conductive ink proposed by the present invention can be utilized as a conductive printing ink for forming wiring, for example. For the printing method, one or more types of printing methods may be selected from the group consisting of, for example, screen printing, inkjet printing, flexographic printing, gravure printing, etc. Under the present invention, preferably one or more types of printing methods selected from the group consisting of screen printing, inkjet printing, etc., is/are selected in light of the excellent printability and shape retainability associated therewith.

It should be noted that, under the screen printing method, any mesh may be selected as deemed appropriate, where preferably just enough mesh to prevent excessive removal of the conductive powder in the conductive ink is adopted.

In terms of film thickness, the coating film produced by applying the conductive ink proposed by the present invention can have any thickness appropriate for various intended uses. It is 1 µm or more, for example, but preferably 2 µm or more, or more preferably 5 µm or more, and 100 µm or less, for example.

The conductive ink proposed by the present invention is excellent in one or more types of properties selected from the groups that consist of conductivity, adhesion to various types of base materials, storage stability, leveling property (surface smoothness), printability, etc.

[Circuit Connection Material]

The circuit connection material proposed by the present invention is used for conductively connecting various electronic components and circuit boards, as well as interconnecting (bonding) electrical/electronic circuits.

The circuit connection material is not specifically limited in shape, etc., but preferably it is in liquid or film form.

A circuit connection material in liquid form can be obtained from the conductive resin solvent proposed by the present invention, or by mixing it with an organic solvent or other solvent, for example.

A circuit connection material in film form can be obtained by, for example, directly casting/applying on a releasable base material the conductive resin composition proposed by the present invention or same that has been mixed with an organic solvent or other solvent, drying the conductive resin composition and removing the solvent to form a film, and then releasing the film from the releasable base material.

Also, a circuit connection material in film form can be obtained by, for example, impregnating a nonwoven fabric, etc., with the conductive resin composition proposed by the present invention or same that has been mixed with an organic solvent or other solvent, shaping the nonwoven fabric, etc., on a releasable base material, drying it and removing the solvent, and then releasing the nonwoven fabric, etc., from the releasable base material.

There is no specific limitation on the electrical connection method, etc., using the circuit connection material proposed by the present invention. Examples include a method whereby the circuit connection material is provided between an electrode of an electronic component, circuit, etc., and an electrode facing it on a base material, and then heated and/or pressurized, as necessary, to electrically connect the two electrodes and also bond the electrodes.

The method for providing the circuit connection material between the electrodes facing each other is not specifically limited. Examples include a method of applying the circuit connection material in liquid form, and a method of sandwiching the circuit connection material in film form, for example.

Also included, for example, when a pin on an electronic component, etc., is to be conductively connected to a circuit, is a method whereby the circuit connection material is provided at the base of the pin to butt-join the pin and thereby constitute a conductive connection.

The circuit connection material proposed by the present invention can be used essentially as an anisotropic conductive material, or it can be used under a method for electrode connection whereby the circuit connection material offering excellent adhesiveness is formed between electrodes on a base material that are facing each other, followed by heating/pressurization, as necessary, to achieve contact between the two electrodes, and bonding between them and the base material. For the base material on which to form the electrodes, semiconductor, glass, ceramics or other inorganic matter, polyimide, polycarbonate or other organic matter, glass/epoxy, etc., or a combination of any multiple thereof, may be adopted.

Furthermore, the circuit connection material proposed by the present invention can form a coating film at low temperature, which makes conductive connection feasible even at low temperatures of 200° C. and lower, for example.

EXAMPLES

The present invention is explained in greater detail below using Examples. It should be noted that the present invention is not limited to these Examples. Unless otherwise specified, "%" and "part(s)" refer to "% by mass" and "part(s) by mass," respectively.

The materials used in the Examples and Comparative Examples are each described below.

<Conductive Powders>

Conductive powder 1: Flake silver-coated copper powder constituted by a flake copper powder coated with 10% by mass of silver (specific surface area: 1.4 m$^2$/g, D50: 2.0 µm, tap density: 3.3 g/cm$^3$; 1100YP manufactured by Mitsui Mining & Smelting Co., Ltd.)

Conductive powder 2: Flake silver-coated copper powder constituted by a flake copper powder coated with 10% by mass of silver (specific surface area: 0.55 m$^2$/g, D50: 2.2 µm, tap density: 5.2 g/cm$^3$; ACPZ-2 manufactured by Mitsui Mining & Smelting Co., Ltd.)

Conductive powder 3: Silver-coated copper powder constituted by a copper powder coated with 10% by mass of silver (specific surface area: 16600 cm$^2$/g, D50: 10.86 µm, tap density: 1.04 g/cm$^3$; 2L3 manufactured by Fukuda Metal Foil & Powder Co., Ltd.)

Conductive powder 4: Silver-coated copper powder constituted by a copper powder coated with 10% by mass of silver (specific surface area: 7.8 cm$^2$/g, D50: 46.8 µm, tap density: 0.77 g/cm$^3$; C3 manufactured by Fukuda Metal Foil & Powder Co., Ltd.)

Conductive powder 5: Silver nano-particle (D50: 500 nm; SPQ02X manufactured by Mitsui Mining & Smelting Co., Ltd.)

<Polyvinyl Butyral-Based Resin>
  PVB1: Polyvinyl butyral-based resin (S-LEC BH-A manufactured by Sekisui Chemical Co., Ltd.)
<Resol-Type Phenol-Based Resins>
  PF1: Resol-type phenol-based resin (MWF-2620 manufactured by Meiwa Plastic Industries, Ltd.)
  PF2: Resol-type phenol-based resin (TAMANOL 586 manufactured by Arakawa Chemical Industries, Ltd.)
<Other Components>
  EC: Ethyl cellulose
  CA: Diethylene glycol monoethyl ether acetate (carbitol acetate)

In the Examples and Comparative Examples, the conductive resin compositions were measured/evaluated for properties (conductivity, adhesion, and storage stability according to the methods described below.

<Conductivity>
A film of each conductive resin composition was produced using a spin coater. The film was measured for volume resistivity using a resistivity meter (Loresta GP-MCP T610 manufactured by Nittoseiko Analytech Co., Ltd.).

Under the present invention, a conductive film with a volume resistivity of under $2.0 \times 10^{-2}$ Ω·cm was considered acceptable.

<Adhesion>
Each conductive resin composition was applied on a glass sheet or PET film (polyethylene terephthalate resin film) to produce a film of 100 μm in thickness.

6 lines as deep as reaching the base material were cut into the obtained film at 2-mm intervals in a grid pattern based on the cross-cutting method according to JIS K 5600, after which a piece of CELLOTAPE (registered trademark) was attached to the film and then peeled off, to evaluate its adhesion to the glass sheet or PET film based on the degree of peeling of the film according to the evaluation criteria below.
  A: The film did not peel.
  C: The film peeled.

<Storage Stability>
Metal cans in which the respective samples of the Examples and Comparative Examples were sealed were stored stationary for 2 months at normal temperature (23±2° C.), after which the samples were measured for viscosity using a viscometer (HBDV2 manufactured by Brookfield Engineering Laboratories, Inc.) and the rate of change in viscosity was calculated based on Formula (1) below, to evaluate storage stability according to the evaluation criteria below.

Rate of change in viscosity=((Viscosity after stationary storage−Viscosity before storage)/Viscosity before storage)×100  (1)

A: The rate of change in viscosity is within ±10%.
  B: The rate of change in viscosity is over ±10% but under ±20%.
  C: The rate of change in viscosity is ±20% or more, or settling/separation has occurred.

Example 1

A conductive resin composition was produced by mixing and agitating 90.0 parts of conductive powder 4 and 10.0 parts of PVB1.

The obtained conductive resin composition was dispersed in 53.0 parts of carbitol acetate to produce a conductive resin composition-dispersed liquid. This was applied on a base material to produce a conductive film, and its conductivity, adhesion, and storage stability were evaluated. The results are shown in Table 1.

Examples 2 to 25, Comparative Examples 1 to 3

Conductive resin compositions were produced in the same manner as in Example 1, except that the constitutional components of conductive resin compositions and their use amounts were changed to those shown in Table 1 and Table 2, and they were evaluated for conductivity, adhesion, and storage stability in the same manners as in Example 1. The results are also shown in Table 1 and Table 2.

TABLE 1

| | Examples | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| Conductive powder 1 | | 95.0 | | | 85.0 | | 93.0 | | 46.5 | 83.7 | 83.7 | 47.0 | | |
| Conductive powder 2 | | | | | | | | 93.0 | 46.5 | 9.3 | | | | 85.5 |
| Conductive powder 3 | | | 95.0 | 93.0 | | 85.0 | | | | | | 47.0 | 95.0 | |
| Conductive powder 4 | 90.0 | | | | | | | | | | | | | |
| Conductive powder 5 | | | | | | | | | | | | 9.3 | | 9.5 |
| PVB1 | 10.0 | 5.0 | 5.0 | 7.0 | 15.0 | 15.0 | 7.0 | 7.0 | 7.0 | 7.0 | 7.0 | 6.0 | 5.0 | 5.0 |
| PFI | | | | | | | | | | | | | | |
| PF2 | | | | | | | | | | | | | | |
| EC | | | | | | | | | | | | | | |
| CA | 53.0 | 27.0 | 27.0 | 37.0 | 80.0 | 80.0 | 37.0 | 37.0 | 37.0 | 37.0 | 37.0 | 32.0 | 27.0 | 27.0 |
| Volume resistivity (Ω · cm) | $8.9 \times 10^{-4}$ | $3.0 \times 10^{-4}$ | $3.1 \times 10^{-3}$ | $1.7 \times 10^{-2}$ | $1.3 \times 10^{-3}$ | $3.3 \times 10^{-3}$ | $2.0 \times 10^{-4}$ | $1.8 \times 10^{-3}$ | $9.2 \times 10^{-4}$ | $3.0 \times 10^{-3}$ | $5.7 \times 10^{-3}$ | $1.3 \times 10^{-3}$ | $1.8 \times 10^{-3}$ | $3.0 \times 10^{-4}$ |
| Glass adhesion | A | A | A | A | A | A | A | A | A | A | A | A | A | A |

TABLE 1-continued

| | Examples | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| PET adhesion | A | A | A | A | A | A | A | A | A | A | A | A | A | A |
| Storage stability | A | A | A | A | A | A | A | A | A | A | A | A | A | A |

TABLE 2

| | Examples | | | | | | | | | | | Comparative Examples | | |
|---|---|---|---|---|---|---|---|---|---|---|---|---|---|---|
| | 15 | 16 | 17 | 18 | 19 | 20 | 21 | 22 | 23 | 24 | 25 | 1 | 2 | 3 |
| Conductive powder 1 | | 90.0 | 92.0 | | | 83.7 | | 93.0 | 93.0 | 93.0 | 93.0 | | 93.0 | 93.0 |
| Conductive powder 2 | | | | 85.0 | 90.0 | | 83.7 | | | | | 90.0 | | |
| Conductive powder 3 | | | | | | 9.3 | | | | | | | | |
| Conductive powder 4 | 85.0 | | | | | | | | | | | | | |
| Conductive powder 5 | | | | | | | 9.3 | | | | | | | |
| PVB1 | 15.0 | 10.0 | 8.0 | 15.0 | 10.0 | 7.0 | 7.0 | 6.3 | 4.9 | 6.3 | 4.9 | | | |
| PF1 | | | | | | | | 0.7 | 2.1 | | | | 7.0 | |
| PF2 | | | | | | | | | | 0.7 | 2.1 | | | 7.0 |
| EC | | | | | | | | | | | | 10.0 | | |
| CA | 80.0 | 53.0 | 43.0 | 80.0 | 53.0 | 37.0 | 37.0 | 43.0 | 36.0 | 42.0 | 33.0 | 53.0 | 7.0 | 5.0 |
| Volume resistivity ($\Omega \cdot cm$) | $9.0 \times 10^{-4}$ | $2.6 \times 10^{-4}$ | $1.0 \times 10^{-3}$ | $6.2 \times 10^{-3}$ | $2.5 \times 10^{-3}$ | $5.4 \times 10^{-4}$ | $3.0 \times 10^{-4}$ | $4.0 \times 10^{-3}$ | $3.0 \times 10^{-3}$ | $9.6 \times 10^{-4}$ | $2.3 \times 10^{-3}$ | $4.0 \times 10^{-3}$ | $1.1 \times 10^{-3}$ | $6.5 \times 10^{-2}$ |
| Glass adhesion | A | A | A | A | A | A | A | A | A | A | A | C | C | C |
| PET adhesion | A | A | A | A | A | A | A | A | A | A | A | C | C | C |
| Storage stability | A | A | A | A | A | A | A | A | A | A | A | A | C | C |

The conductive resin compositions pertaining to Examples 1 to 25, which were found acceptable in the conductivity evaluation and adhesion evaluation, were free of settling/separation, etc., and also had good fluidity without thickening, etc., after the storage stability test.

The following points can be observed from Table 1 and Table 2.

The conductive resin compositions in the Examples have excellent conductivity, adhesion, and storage stability.

The conductive resin composition in Comparative Example 1, which contains ethyl cellulose instead of polyvinyl butyral-based resin, does not have sufficient adhesion to glass or PET.

The conductive resin composition in Comparative Example 2, which contains a resol-type phenol-based resin (PF1) instead of polyvinyl butyral-based resin, does not have sufficient adhesion to glass or PET. Furthermore, its storage stability is not sufficient.

The conductive resin composition in Comparative Example 3, which contains a resol-type phenol-based resin (PF2) instead of polyvinyl butyral-based resin, does not have sufficient adhesion to glass or PET, nor does it offer good conductivity due to a high volume resistivity of the conductive film. Furthermore, its storage stability is not sufficient.

INDUSTRIAL FIELD OF APPLICATION

The conductive resin composition proposed by the present invention is useful as a printed electronics material, and extremely useful in the mass-production of display devices, vehicle-related components, IoT, mobile communication systems and various other electronic devices, and the like.

What is claimed:

1. A conductive resin composition containing:
   (a) conductive powder consisting of silver-coated copper powder alone or a mixture of silver-coated copper powder and silver powder; and
   (b) a polyvinyl butyral-based resin; and
   also containing:
   (c) a resol-type phenol-based resin by 0 to 75 parts by mass relative to 100 parts by mass of the polyvinyl butyral-based resin,
   wherein a content of the polyvinyl butyral-based resin is 2.0% by mass or more and 25.0% by mass or less, relative to a total amount of the conductive powder, polyvinyl butyral-based resin, and resol-type phenol-based resin, which represents 100% by mass.

2. A conductive ink containing the conductive resin composition according to claim 1.

3. A circuit connection material containing the conductive resin composition according to claim 1.

* * * * *